(12) United States Patent
Nakazato et al.

(10) Patent No.: US 8,643,171 B1
(45) Date of Patent: Feb. 4, 2014

(54) POWER SEMICONDUCTOR DEVICE

(75) Inventors: Shigeyuki Nakazato, Chiyoda-ku (JP); Yoichi Goto, Chiyoda-ku (JP); Kiyofumi Kitai, Chiyoda-ku (JP); Toru Kimura, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/993,348

(22) PCT Filed: Jul. 31, 2012

(86) PCT No.: PCT/JP2012/069487
§ 371 (c)(1),
(2), (4) Date: Jun. 12, 2013

(51) Int. Cl.
*H01L 23/10* (2006.01)
*H01L 23/043* (2006.01)

(52) U.S. Cl.
USPC ............................ 257/707; 257/720; 165/80.3

(58) Field of Classification Search
USPC .......... 257/675, 706, 707, 717, 720; 165/80.3
See application file for complete search history.

(56) References Cited

U.S. PATENT DOCUMENTS

| | | | |
|---|---|---|---|
| 2002/0070005 A1* | 6/2002 | Kawabata et al. | 165/80.3 |
| 2004/0190260 A1 | 9/2004 | Sasaki | |
| 2006/0018765 A1 | 1/2006 | Fransson et al. | |
| 2012/0227952 A1* | 9/2012 | Yoshihara et al. | 165/185 |

FOREIGN PATENT DOCUMENTS

| | | |
|---|---|---|
| JP | 2004-303866 A | 10/2004 |
| JP | 2006-237149 A | 9/2006 |
| JP | 2009-81157 A | 4/2009 |
| JP | 2012-49167 A | 3/2012 |

OTHER PUBLICATIONS

International Search Report for PCT/JP2012/069487 dated Oct. 23, 2012.

\* cited by examiner

*Primary Examiner* — William D Coleman
*Assistant Examiner* — John M Parker
(74) *Attorney, Agent, or Firm* — Sughrue Mion, PLLC

(57) ABSTRACT

A power semiconductor device includes: a mold unit that includes a power semiconductor element, a base plate, and a mold unit, the power semiconductor element being mounted on one surface of the base plate, a convex portion being formed on an other surface of the base plate, the convex portion including a plurality of grooves, the mold unit having a mold resin with which the power semiconductor element is sealed in such a manner as to expose the convex portion; a plurality of radiation fins inserted into the grooves, respectively, and fixedly attached to the base plate by swaging; and a metal plate that includes a opening into which the convex portion is inserted, the metal plate being arranged between the mold unit and the radiation fins with the convex portion inserted into the opening, wherein the metal plate includes a protrusion that protrudes from an edge of the opening and that digs into a side surface of the convex portion when the convex portion is inserted into the opening.

3 Claims, 6 Drawing Sheets

POWER SEMICONDUCTOR DEVICE

CROSS REFERENCE TO RELATED APPLICATIONS

This application is a National Stage of International Application No. PCT/JP2012/069487 filed Jul. 31, 2012, the contents of which are incorporated herein by reference in their entirety.

FIELD

The present invention relates to a power semiconductor device.

BACKGROUND

Conventionally, when a heat sink is attached for cooling electronic components (power semiconductor elements) that generate a large amount of heat such as a CPU (central processing unit) and a power transistor, application of thermal grease is widely performed to fill a minute gap between a contact surface of the electronic components and that of the heat sink to improve heat dissipation performance.

The thermal conductivity of the thermal grease is quite lower than those of metals. Accordingly, a radiation-fin-integrated power semiconductor device having radiation fins integrated with a base plate of a metallic part of the power semiconductor device without using the thermal grease is also realized to further improve the heat dissipation performance. In the radiation-fin-integrated power semiconductor device, grooves for joining the radiation fins are provided in the base plate, resin molding is performed in a state of exposing a part of the surface of the base plate including a portion in which these grooves are formed, and the radiation fins are inserted into the grooves of the base plate and then swaged to be fixedly attached to the grooves, thereby integrating the base plate with the radiation fins to improve the heat dissipation performance.

In relation to the power semiconductor device adapted to improve the heat dissipation performance, it is known that radiation noise from power semiconductor elements and malfunction is suppressed by inserting a metal plate between the radiation fins and the base plate and by causing this metal plate to function to connect the power semiconductor device to an earth potential (see Patent Literature 1).

CITATION LIST

Patent Literature

Patent Literature 1: Japanese Patent Application Laid-open No. 2012-49167

SUMMARY

Technical Problem

In the conventional technique, heating and cooling is carried out at a time of sealing the power semiconductor elements with resin. This often causes a module of the power semiconductor device to be completed in a warped state or causes the metal plate to be inserted itself to be warped. Therefore, the conventional technique has a problem that a gap is generated between the metal plate and the base plate, which increases the electrical resistance between the metal plate and the base plate. Furthermore, an oxide film is formed in the atmosphere on the surface of the base plate that is a metal, and the oxide film on the metal is higher than the metal itself in the electrical resistance. With the conventional technique, an electrical contact between the metal plate and the base plate is realized by placing the metal plate between the radiation fins and the base plate. Accordingly, the metal plate and the base plate are electrically connected to each other via the oxide film formed on the surface of the base plate except for minute regions where the oxide film on the surface of the base plate is damaged as a result of the contact of the metal plate with the base plate and where the metal is exposed. For this reason, even if neither the metal plate nor the base plate is warped and the base plate comes in surface contact with the metal plate, a ratio of portions that are made conductive as a result of the contact of the metals is low, disadvantageously resulting in a high electrical resistance between the base plate and the metal plate.

The present invention has been achieved to solve the above problems, and an object of the present invention is to provide a power semiconductor device having an enhanced effect of suppressing radiation noise from a power semiconductor element and malfunction.

Solution to Problem

There is provided a power semiconductor device comprising: a mold unit that includes a power semiconductor element, a base plate, and a mold resin, the power semiconductor element being mounted on one surface of the base plate, a convex portion being formed on an other surface of the base plate, the convex portion including a plurality of grooves, the power semiconductor element being sealed with the mold resin in such a manner as to expose the convex portion; a plurality of radiation fins inserted into the grooves, respectively, and fixedly attached to the base plate by swaging; and a metal plate that includes a cut-off portion into which the convex portion is inserted, the metal plate being arranged between the mold unit and the radiation fins with the convex portion inserted into the cut-off portion, wherein the metal plate includes a protrusion that protrudes from an edge of the cut-off portion and that digs into a side surface of the convex portion when the convex portion is inserted into the cut-off portion.

Advantageous Effects of Invention

The power semiconductor device according to the present invention can reduce the electrical resistance between a base plate and a metal plate and enhance the effect of suppressing radiation noise from power semiconductor elements and malfunction.

DESCRIPTION OF EMBODIMENTS

Exemplary embodiments of a power semiconductor device according to the present invention will be explained below in detail with reference to the accompanying drawings. The present invention is not limited to the embodiments.

First Embodiment

Figure 1:
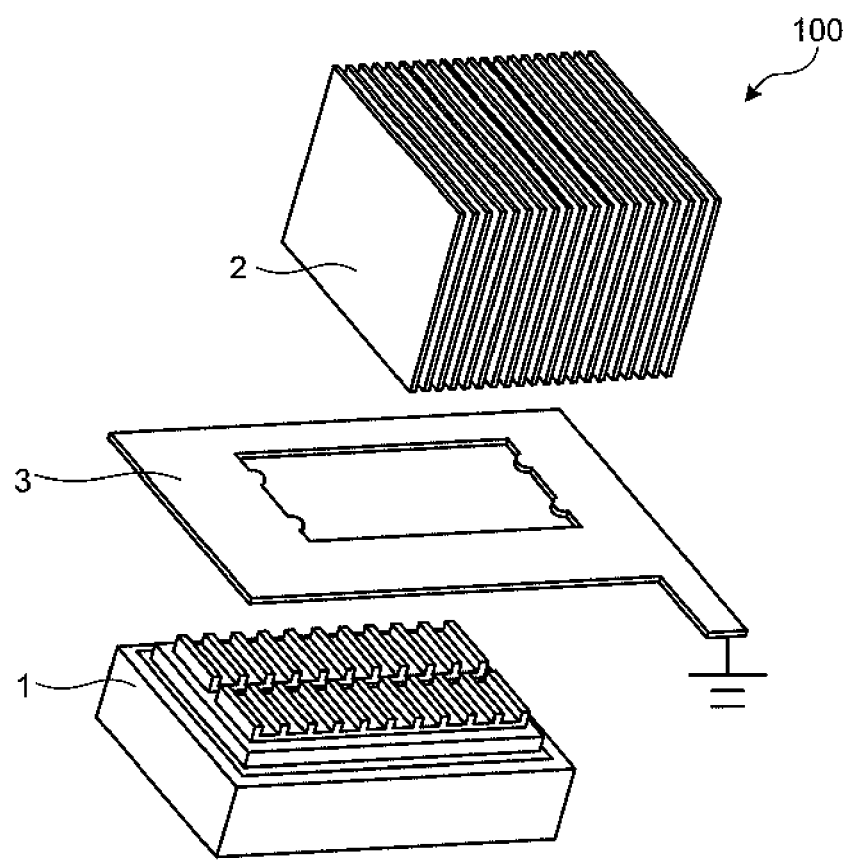
FIG. 1 is an exploded perspective view of a configuration of a power semiconductor device according to a first embodiment of the present invention.
Figure 2:
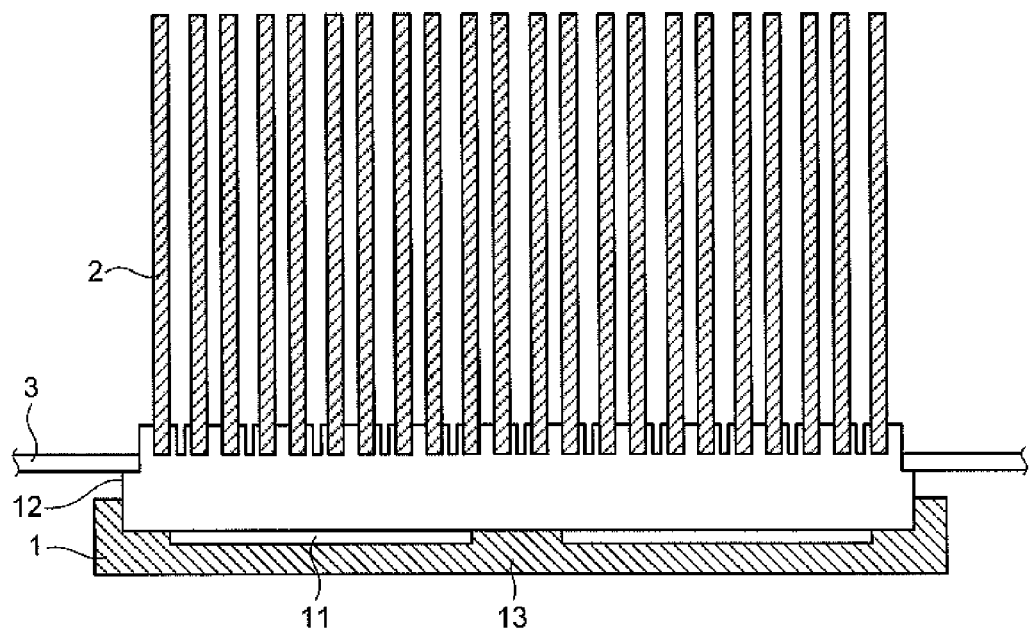
FIG. 2 is a cross-sectional view of the power semiconductor device according to the first embodiment.

FIG. 1 is an exploded perspective view of a configuration of a power semiconductor device according to a first embodiment of the present invention. FIG. 2 is a cross-sectional view of the power semiconductor device according to the first embodiment. A power semiconductor device 100 according to the first embodiment includes a mold unit 1, radiation fins 2, and a metal plate 3.

Figure 3:
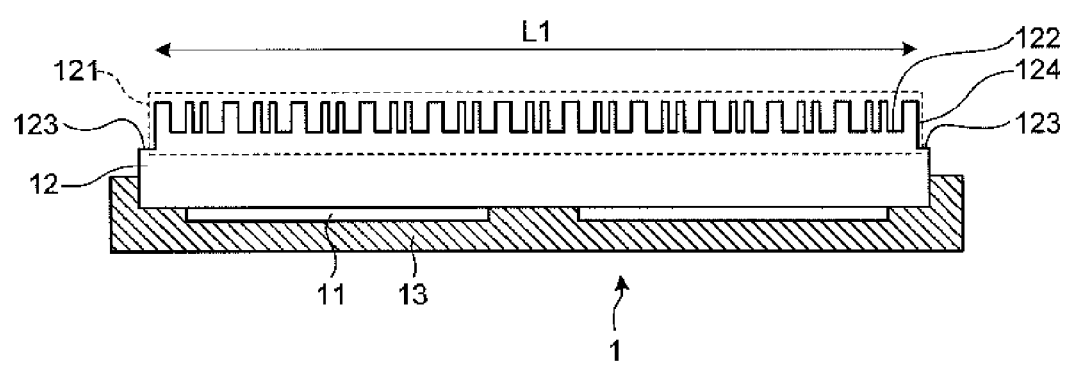
FIG. 3 is a cross-sectional view of a mold unit in the power semiconductor device according to the first embodiment.

FIG. 3 is a cross-sectional view of the mold unit in the power semiconductor device according to the first embodiment. The mold unit 1 includes power semiconductor elements 11, a base plate 12 having one surface on which the power semiconductor elements 11 are mounted, and a mold resin 13 with which the power semiconductor elements 11 are sealed. The mold unit 1 is formed by integrally molding the base plate 12 on which the power semiconductor elements 11 are mounted with the mold resin 13. A convex portion 121 is formed on a surface of the base plate 12 opposite to the surface on which the power semiconductor elements 11 are mounted, and the convex portion 121 protrudes from the mold resin 13. A plurality of grooves 122 are provided in the convex portion 121. Peripheral edges of the convex portion 121 form a flat surface 123. The base plate 12 is formed using, as a material, a metal (such as aluminum) softer and higher in thermal conductivity than the metal plate 3.

Figure 4:
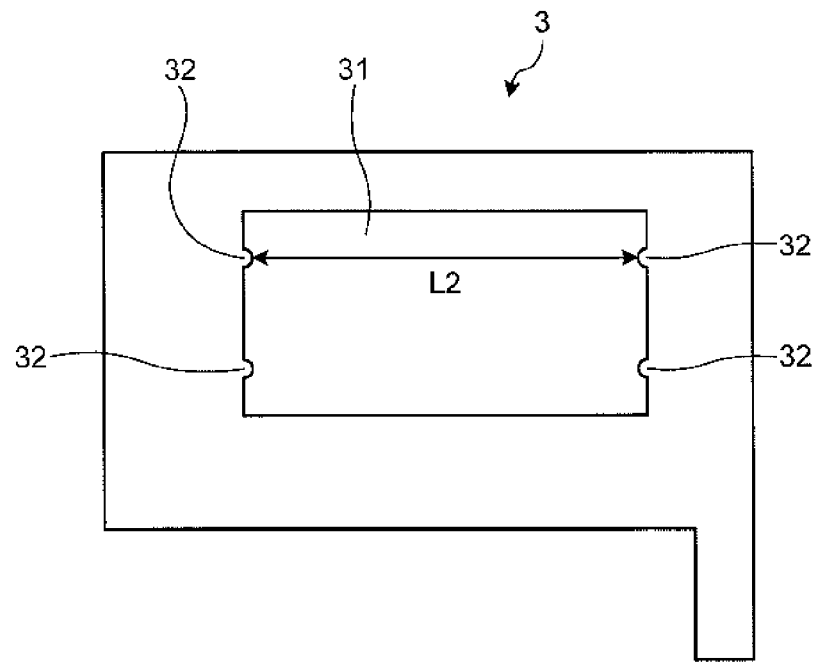
FIG. 4 is a plan view of a metal plate in the power semiconductor device according to the first embodiment.

FIG. 4 is a plan view of the metal plate in the power semiconductor device according to the first embodiment. A substantially rectangular opening 31 is cut off from the metal plate 3 as a cut-off portion, and the convex portion 121 can be inserted into the opening 31. The substantially rectangular shape mentioned in this case includes a shape having rounded shape portion to prevent concentration of a stress on the corners. Protrusions 32 are provided on edges of two opposed sides (two short sides in this case) of the opening 31. The distance L2 between tip ends of the two protrusions 32 is smaller than the width L1 of the convex portion 121 on the base plate 12. The metal plate 3 is formed using a metal harder than the material of the base plate 12. For example, a steel plate can be applied as the metal plate 3.

The radiation fins 2 are thin-plate fins and as many radiation fins 2 as the grooves 122 provided in the convex portion 121 are prepared. The radiation fins 2 are inserted into the respective grooves 122 of the convex portion 121, swaged in such a manner as to be pressed from left and right sides, and fixed to the base plate 12.

Figure 5:
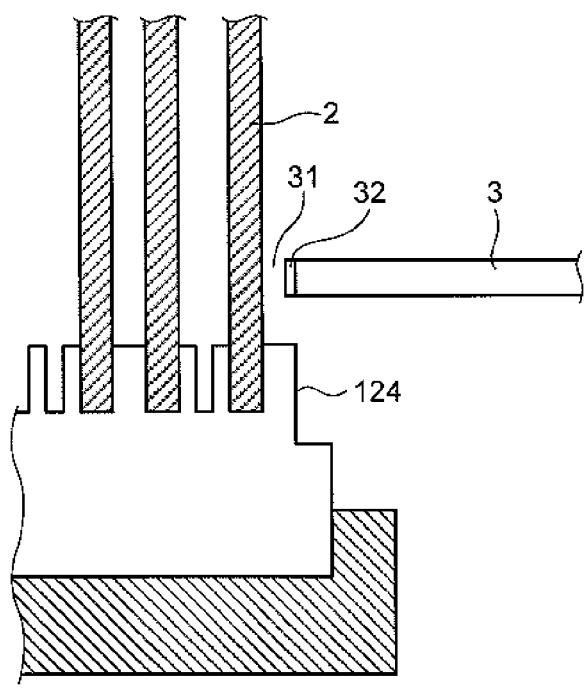
FIG. 5 is an enlarged cross-sectional view of a portion in which the metal plate contacts a base plate.
Figure 6:
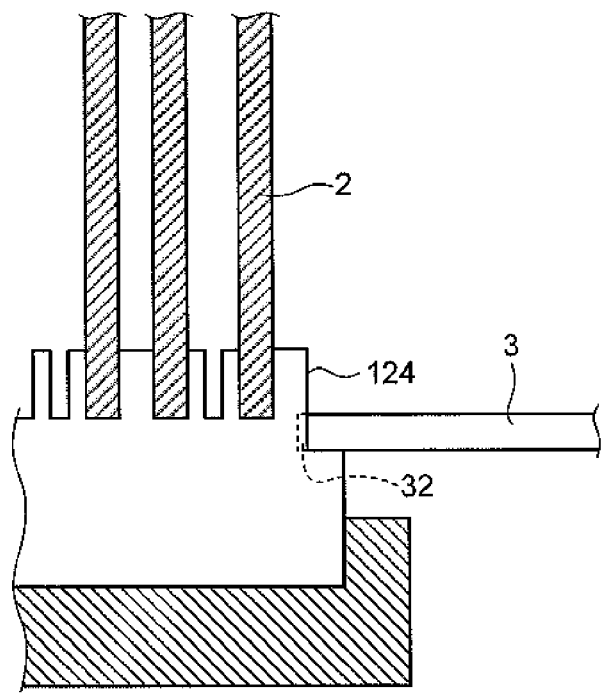
FIG. 6 is an enlarged cross-sectional view of the portion in which the metal plate contacts the base plate.

FIGS. 5 and 6 are enlarged cross-sectional views of a portion in which the metal plate contacts the base plate. FIG. 5 depicts a state before the convex portion 121 is inserted into the opening 31 and FIG. 6 depicts a state after the convex portion 121 is inserted into the opening 31. Because the distance L2 between the tip ends of the protrusions 32 is smaller than the width L1 of the convex portion 121 on the base plate 12, the protrusions 32 scrapes side surfaces 124 of the convex portion 121 when the convex portion 121 on the base plate 12 is inserted into the opening 31, and the convex portion 121 is fitted into the opening 31 in a state in which the protrusions 32 dig into the side surfaces 124 of the convex portion 121. At that time, an oxide film on the surface of the base plate 12 is damaged, an internal non-oxidized metal is exposed, and electrical connection between the metal plate 3 and the base plate 12 is realized. By allowing the protrusions 32 to act as portions in which the metals contact each other as a whole, an electrical resistance between the metal plate 3 and the base plate 12 can be reduced.

If the protrusions 32 are too small, it is difficult to secure a sufficient area of the portions made conductive as a result of the contact of the metals between the metal plate 3 and the base plate 12. If the protrusions 32 are too large, a gap between the metal plate 3 and the base plate 12 becomes large to hinder the downscaling of the power semiconductor device 100. When the size of each protrusion 32 is set to about 0.5 millimeter to 1.5 millimeters, it is possible to secure the area of the portions made conductive as a result of the contact of the metals between the metal plate 3 and the base plate 12 without increasing the power semiconductor device 100 in the size. However, this range is given only as an example and the present invention is not limited to this range.

The metal plate 3 of a shape having the protrusions 32 on the edges of only the two short sides of the opening 31 has been described by way of example. Alternatively, the protrusions 32 can be provided on edges of only long sides of the opening 31 or provided on the edges of both the short sides and the long sides thereof. When the protrusions 32 are provided on the edge of only one of two opposed sides of the opening 31, a side surface of the metal plate 3 on the side on which no protrusions 32 are provided is pressed against the side surface 124 of the convex portion 121. This can reduce the electrical resistance between the metal plate 3 and the base plate 12 as compared with a conventional structure that provides conduction on the flat surface 123. Furthermore, the number of protrusions 32 provided on the edge of each side of the opening 31 is not limited to two but can be two or more, or two or less. Further, the number of protrusions 32 can be set differently among the edges of the respective sides of the opening 31.

Figure 7:
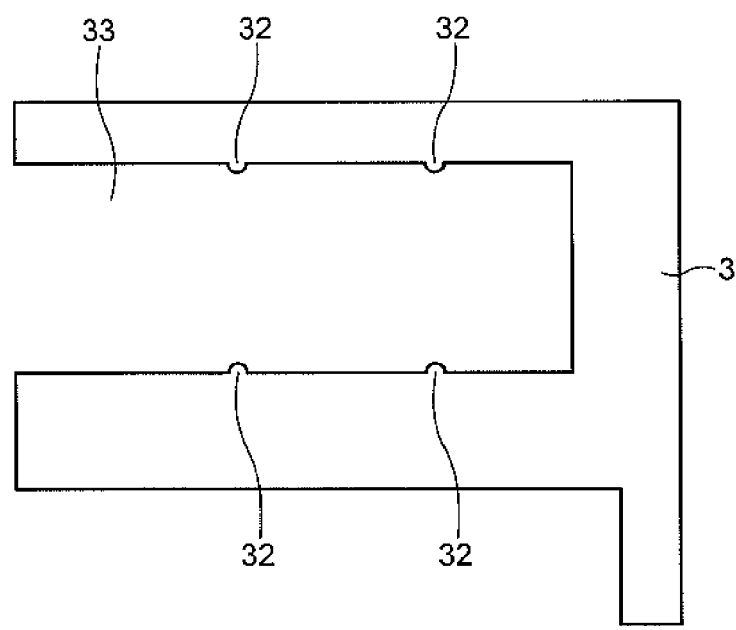
FIG. 7 is an example of the metal plate from which a notch is cut off as a cut-off portion.

It has been described above that the opening 31 into which the convex portion 121 is inserted is cut off from the metal plate 3 as the cut-off portion. Alternatively, a notch 33 instead of the opening 31 can be cut off as the cut-off portion to form the metal plate 3 into a substantially U-shape. FIG. 7 is an example of the metal plate from which the notch is cut off as the cut-off portion. When the notch 33 into which the convex portion 121 is inserted is cut off as the cut-off portion, the protrusions 32 can be formed on two opposed sides across an open side, thereby scraping the side surfaces 124 of the convex portion 121 when the convex portion 121 is inserted into the notch 33. By providing the cut-off portion into which the convex portion 121 can be inserted to have a notch shape, it is possible to reduce an amount of the material used for the metal plate 3.

The power semiconductor device according to the first embodiment can reduce the electrical resistance between the base plate and the metal plate and enhance the effect of suppressing radiation noise from the power semiconductor elements and malfunction.

Second Embodiment

Figure 8:
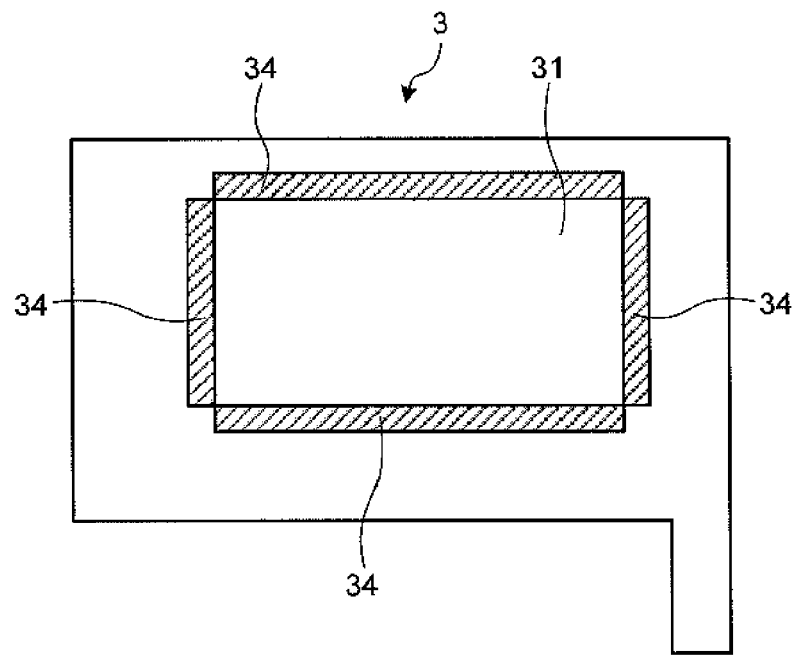
FIG. 8 is a plan view of a metal plate in a power semiconductor device according to a second embodiment of the present invention.

A power semiconductor device according to a second embodiment is similar to that according to the first embodiment and includes the mold unit 1, the radiation fins 2, and the metal plate 3 as shown in FIGS. 1 and 2. As shown in FIG. 3, the mold unit 1 includes the power semiconductor elements 11, the base plate 12 on which the power semiconductor elements 11 are mounted, and the mold resin 13 with which the power semiconductor elements 11 are sealed. FIG. 8 is a plan view of the metal plate in the power semiconductor device according to the second embodiment. The opening 31 is cut off from the metal plate 3 as the cut-off portion and the convex portion 121 can be inserted into the opening 31. A metal foil 34 is bonded to edges of four sides of the opening 31. As the metal foil 34, a foil such as a copper foil or an aluminum foil high in malleability and made of a softer metal than the metal plate 3 is applicable.

Figure 9:
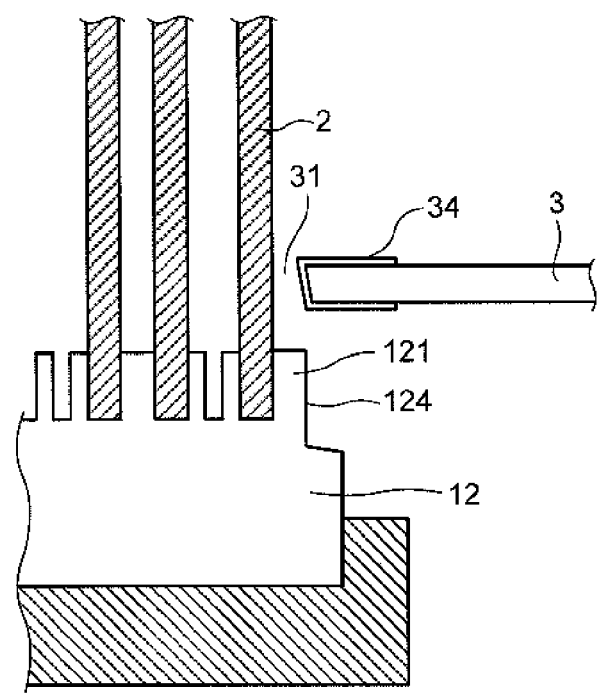
FIG. 9 is an enlarged cross-sectional view of a portion in which the metal plate contacts a base plate.
Figure 10:
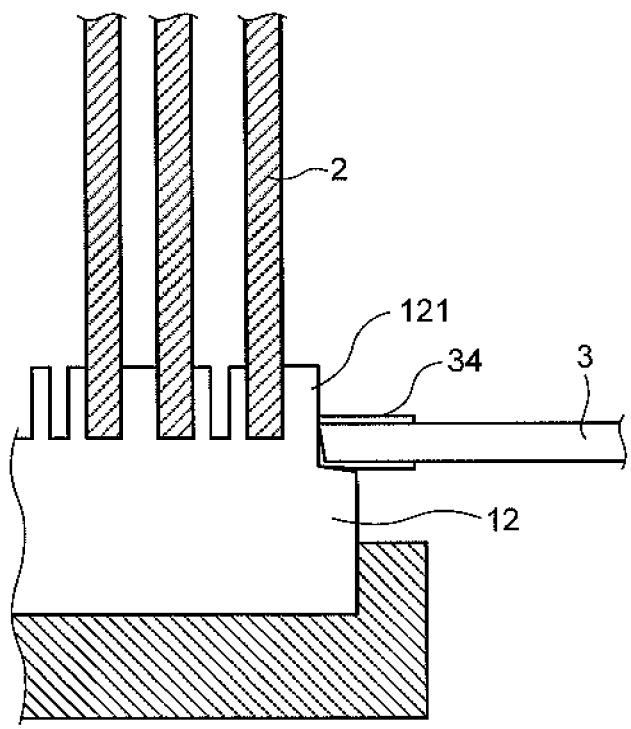
FIG. 10 is an enlarged cross-sectional view of the portion in which the metal plate contacts the base plate.

FIGS. 9 and 10 are enlarged cross-sectional views of a portion in which the metal plate contacts the base plate. FIG. 9 depicts a state before the convex portion 121 is inserted into the opening 31 and FIG. 10 depicts a state after the convex portion 121 is inserted into the opening 31. When the convex portion 121 on the base plate 12 is inserted into the opening 31, the metal foil 34 deforms to conform to a shape of the gap between the base plate 12 and the metal plate 3. By causing the metal foil 34 to fill the gap between the base plate 12 and the metal plate 3, it is possible to increase a contact area in which the metal plate 3 contacts the base plate 12 and to reduce the electrical resistance between the metal plate 3 and the base plate 12.

If the metal foil 34 is too thin, the metal foil 34 cannot sufficiently fill the gap between the base plate 12 and the metal plate 3, and it is difficult to secure a sufficient contact area in which the metal plate 3 contacts the base plate 12. If the metal foil 34 is too thick, the metal foil 34 does not easily deform, and it is difficult to secure a sufficient contact area in which the metal plate 3 contacts the base plate 12. When the thickness of the metal foil 34 is set to about 0.1 millimeter to 0.3 millimeter, the contact area in which the metal plate 3 contacts the base plate 12 can be easily secured. However, this range is given only as an example and the present invention is not limited to this range.

It has been described above that the power semiconductor device is configured to use the metal plate 3 having the metal foil 34 bonded to the edges of the four sides of the opening 31 by way of example. It suffices to bond the metal foil 34 to the edge of at least one side of the opening 31. However, it is desirable to arrange the metal foil 34 on the edges of all the sides of the opening 31 in view of increasing the contact area in which the base plate 12 contacts the metal plate 3. Similarly to the first embodiment, the notch 33 instead of the opening 31 can be cut off from the metal plate 3 as the cut-off portion.

Similarly to the first embodiment, the power semiconductor device according to the second embodiment can reduce the electrical resistance between the base plate and the metal plate and enhance the effect of suppressing radiation noise from the power semiconductor elements and malfunction.

INDUSTRIAL APPLICABILITY

As described above, the power semiconductor device according to the present invention is useful in a feature that it can enhance the effect of suppressing radiation noise from power semiconductor elements and malfunction.

REFERENCE SIGNS LIST 1 mold unit, 2 radiation fin, 3 metal plate, power semiconductor element, 12 base plate, 13 mold resin, 31 opening, 32 protrusion, 33 notch, 34 metal foil, 100 power semiconductor device, 121 convex portion, 122 groove, 123 flat surface, 124 side surface.

The invention claimed is:

1. A power semiconductor device comprising:
a mold unit that includes a power semiconductor element, a base plate, and a mold resin, the power semiconductor element being mounted on one surface of the base plate, a convex portion being formed on an other surface of the base plate, the convex portion including a plurality of grooves, the power semiconductor element being sealed with the mold resin in such a manner as to expose the convex portion;
a plurality of radiation fins inserted into the grooves, respectively, and fixedly attached to the base plate by swaging; and
a metal plate that includes a cut-off portion into which the convex portion is inserted, the metal plate being arranged between the mold unit and the radiation fins with the convex portion inserted into the cut-off portion, wherein
the metal plate includes a protrusion that protrudes from an edge of the cut-off portion and that digs into a side surface of the convex portion when the convex portion is inserted into the cut-off portion.

2. The power semiconductor device according to claim 1, wherein
the cut-off portion is substantially rectangular, and the protrusion is formed on each of edges of two opposed sides of the cut-off portion.

3. A power semiconductor device comprising:
a mold unit that includes a power semiconductor element, a base plate, and a mold unit, the power semiconductor element being mounted on one surface of the base plate, a convex portion being formed on an other surface of the base plate, the convex portion including a plurality of grooves, the mold unit having a mold resin with which the power semiconductor element is sealed in such a manner as to expose the convex portion;
a plurality of radiation fins inserted into the grooves, respectively, and fixedly attached to the base plate by swaging; and
a metal plate that includes a cut-off portion into which the convex portion is inserted, the metal plate being arranged between the mold unit and the radiation fins with the convex portion inserted into the cut-off portion, wherein
the metal plate includes a metal foil that is arranged on an edge of the cut-off portion and that is wedged between the convex portion and the cut-off portion when the convex portion is inserted into the cut-off portion.

* * * * *